United States Patent [19]

Kimura

[11] 4,297,597
[45] Oct. 27, 1981

[54] DARLINGTON-CONNECTED SEMICONDUCTOR DEVICE

[75] Inventor: Takashi Kimura, Yokohama, Japan

[73] Assignee: Tokyo Shibaura Denki Kabushiki Kaisha, Japan

[21] Appl. No.: 48,003

[22] Filed: Jun. 13, 1979

[30] Foreign Application Priority Data

Jun. 20, 1978 [JP] Japan .................................. 53/73734

[51] Int. Cl.³ ........................ H03K 3/26; H01L 29/72
[52] U.S. Cl. ............................. 307/315; 307/299 A;
307/303; 357/36; 357/46; 330/310
[58] Field of Search ................... 307/299 A, 315, 303;
357/36, 46; 330/310

[56] References Cited

U.S. PATENT DOCUMENTS

| | | | |
|---|---|---|---|
| 3,416,043 | 12/1968 | Jorgensen | 357/36 |
| 3,544,860 | 12/1970 | Lichowsky | 307/315 |
| 4,031,416 | 6/1977 | Peil | 307/315 |
| 4,072,979 | 2/1978 | Palara | 357/36 |
| 4,119,997 | 10/1978 | Fulkerson | 357/36 |

FOREIGN PATENT DOCUMENTS 48-21785 6/1973 Japan .

Primary Examiner—Stanley D. Miller, Jr.
Assistant Examiner—B. P. Davis
Attorney, Agent, or Firm—Finnegan, Henderson, Farabow, Garrett & Dunner

[57] ABSTRACT

A Darlington-connected semiconductor device comprises a pre-stage transistor having multi-emitter electrodes and a rear-stage transistor having multi-base electrodes. The multi-emitter electrodes of the pre-stage transistor are connected to the multi-base electrodes of the rear-stage transistor through a plurality of resistors, respectively.

6 Claims, 13 Drawing Figures

DARLINGTON-CONNECTED SEMICONDUCTOR DEVICE

BACKGROUND OF THE INVENTION

This invention relates to a semiconductor device with high gain and high withstand voltage, more specifically to a bipolar semiconductor device exhibiting high gain and high withstand voltage in a high frequency range.

In order to obtain high gain in the high frequency range, a bipolar transistor must be so designed as to have optimum characteristic elements (parameters). Above all, it is to be desired that D.C. current-amplification factor $h_{FE}$ should be high enough. In manufacturing a single transistor with a high current-amplification factor, however, collector-emitter withstand voltage $V_{CEO}$ would be lowered to cause difficulties in practical use. The withstand voltage $V_{CEO}$ has the following connection with collector-base withstand voltage $V_{CBO}$ and current-amplification factor $h_{FE}n$. That is $$V_{CEO} \alpha V_{CBO}/h_{FE}n.$$

Here n is a constant determined according to the semiconductor manufactured. As may be understood from the above expression, $V_{CEO}$ decreases as $h_{FE}$ increases. Determined mainly by the specific resistance of a collector layer, $V_{CBO}$ is set at an optimum value by means of the supply voltage used, and is prohibited from being unduly increased. $V_{CEO}$ may, therefore, be increased by reducing $h_{FE}$, though, in such case, the gain will be lowered to constitute an obstacle to use. It is generally known that, in a low frequency range, $h_{FE}$ of the transistor device is increased synthetically by Darlington-connecting a plurality of transistors with relatively low $h_{FE}$. In such Darlington connection, apparent $h_{FE}$ is equal to the product of the respective current-amplification factors of a plurality of series-connected transistors. A high-frequency, high-output transistor needs to use a shallow collector-base junction, requiring a very wide safe operation range. Accordingly, current concentration may result in the Darlington connection, and, in a high-frequency transistor, the inductance of a connecting lead will affect the transistor device as parasitic impedance. Thus, this type of Darlington connection would not be able to provide satisfactory high frequency response.

SUMMARY OF THE INVENTION

Accordingly, the object of this invention is to provide a semiconductor device with a wide safe operation range and exhibiting high gain and high withstand voltage in a high frequency range.

According to this invention, there is provided a Darlington-connected semiconductor device in which a pre-stage transistor is of multi-emitter electrode structure, while a rear-stage transistor is of multi-base electrode structure, the multi-emitter electrodes of the pre-stage transistor being connected respectively to the multi-base electrodes of the rear-stage transistor through respective resistors.

BRIEF DESCRIPTION OF THE DRAWING

As shown in FIGS. 1 and 2, a pre-stage transistor 11 and a rear-stage transistor 12 have a common collector formed of an $N^{30}$ semiconductor substrate 13 with specific resistance of approximately $0.01\Omega$. cm and an N-type epitaxial layer 14 formed on the substrate 13 by the gas-phase growth method and having specific resistance of approximately $1.5\Omega$. cm. The pre-stage transistor 11 has a base region 15 composed of a P-type diffusion region formed by diffusing e.g. boron into the epitaxial layer 14 and having surface density of about $10^{19}/cm^3$. Phosphor, for example, is selectively diffused into the base region 15 to form multi-emitter regions 16 and 17 with surface density of about $10^{21}/cm^3$. Emitter electrodes 18 and 19 are formed on these emitter regions 16 and 17 respectively, while a pectinate base electrode 20 is formed on the base region 15 so as not to be in touch with the emitter regions 16 and 17. The pectinate base electrode 20 is connected to a base lead L1.

Figure 1:
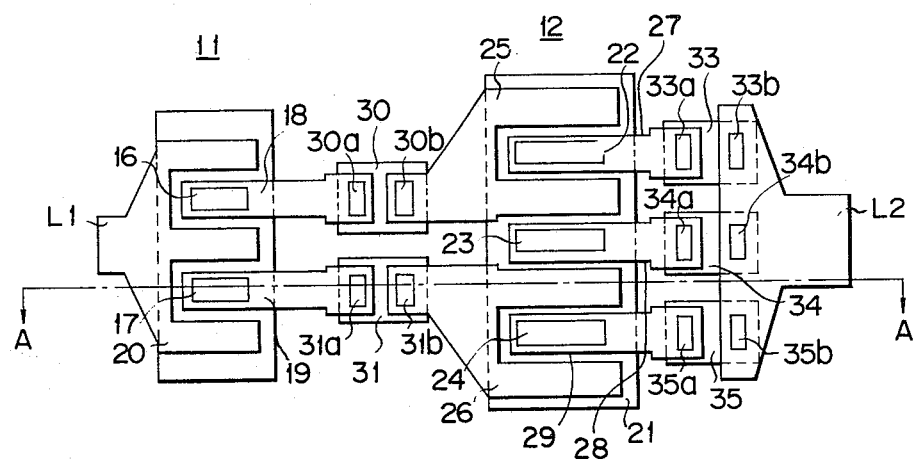
FIG. 1 is a plan of a semiconductor device according to an embodiment of this invention.
Figure 2:
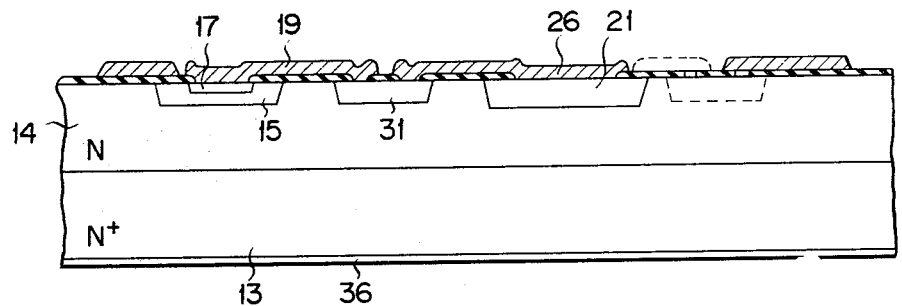
FIG. 2 is a sectional view of the semiconductor device as taken along line A—A of FIG. 1.

The rear-stage transistor 12 has a base region 21 formed in the epitaxial layer 14 in the same manner as the case of the pre-stage transistor 11 and multi-emitter regions 22, 23 and 24. Two pectinate base electrodes 25 and 26 are formed on the base region 21 so as not to be in touch with the multi-emitter regions 22, 23 and 24. Further, emitter electrodes 27, 28 and 29 are formed on the multi-emitter regions 22, 23 and 24, respectively.

Resistor regions 30 and 31 are formed in the epitaxial layer 14 between the respective base regions 15 and 21 of the pre- and rear-stage transistors 11 and 12. These resistor regions 30 and 31 are ohmic-connected by means of input electrodes 30a and 31a and output electrodes 30b and 31b. The input electrodes 30a and 31a are connected respectively to the emitter electrodes 18 and 19 of the pre-stage transistor 11, while the output electrodes 30b and 31b are connected respectively to the pectinate base electrodes 25 and 26 of the rear-stage transistor 12. Resistor regions 33, 34 and 35 are formed in the epitaxial layer 14 between the base region 21 of the rear-stage transistor 12 and an output lead L2. These resistor regions 33, 34 and 35 are ohmic-connected by means of input electrodes 33a, 34a and 35a and output electrodes 33b, 34b and 35b. The input electrodes 33a, 34a and 35a are connected respectively to the multi-emitter electrodes 22, 23 and 24 of the rear-stage transistor 12, while the output electrodes 33b, 34b and 35b are connected in common to the output lead L2. The resistor regions 30, 31, 33, 34 and 35 are separately formed at the same time by diffusing e.g. boron or by ion implantation. The base regions 15 and 21, as well as the emitter regions 16, 17, 22, 23 and 24, of the pre- and rear-stage transistors 11 and 12 are formed simultaneously. The collectors of both these transistors 11 and 12 are formed in a common region, that is, the semiconductor substrate 13 and the epitaxial layer 14, a collector electrode 36 being formed on the substrate 13. The collector electrode may be formed on the same side with the base and emitter electrodes.

Figure 3:
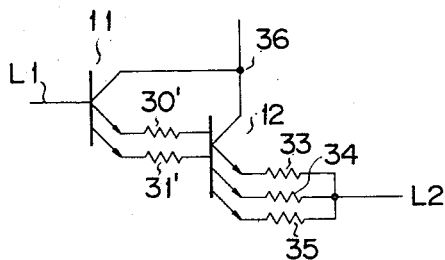
FIG. 3 is an equivalent circuit diagram of the semiconductor device of FIG. 1.

The semiconductor device of the above-mentioned semiconductor device forms a Darlington circuit as shown in FIG. 3. In this circuit, the multi-emitters of the pre-stage transistor 11 are connected respectively to the multi-bases of the rear-stage transistor 12 through respective resistors 30' and 31', while the multi-emitters of the rear-stage transistor 12 are connected to the lead L2 through respective resistors 33', 34' and 35'. Thus, when the resistors 30' and 31' are connected respectively between the multi-emitters of the pre-stage transistor 11 and the multi-bases of the rear-stage transistor 12, current crowding will be caused at the rear-stage transistor 12. If the base current corresponding to the portion subject to such current crowding is increased, it will flow through the resistor 30' and 31' to increase the voltage drop thereat. Consequently, the bias of the pre-stage transistor changes to decrease the emitter current of the corresponding emitter region of the pre-stage transistor. The decrease in the emitter current causes the base current of the corresponding base region of the rear-stage transistor to be reduced, thereby preventing breakdown of the transistor that may otherwise be caused by the current crowding. That is, the emitter current crowding of the rear-stage transistor is improved. Moreover, the respective base-collector junction regions of the pre- and rear-stage transistors 11 and 12 are formed in a single body, so that a large base region may be incorporated in a small-size chip.

Figure 4:
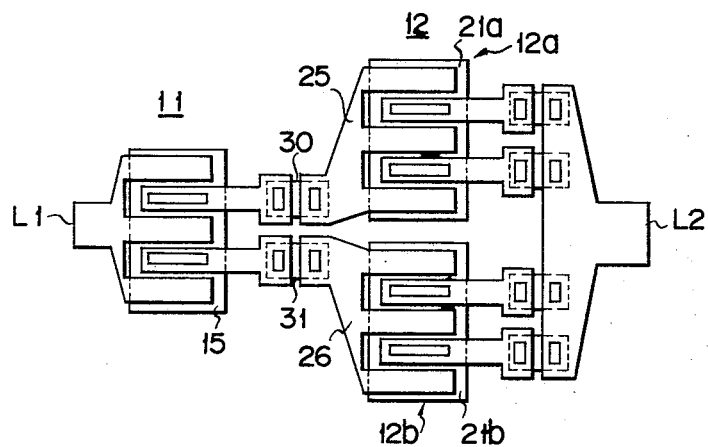
FIG. 4 is a plan of a semiconductor device according to another embodiment in which the base regions of rear-stage transistors are separated.
Figure 5:
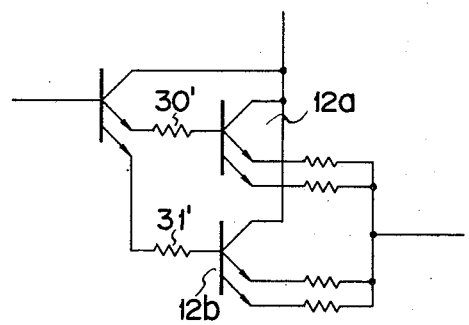
FIG. 5 is an equivalent circuit diagram of the semiconductor device of FIG. 4.

In an embodiment of FIG. 4, the base region 21 of the rear-stage transistor 12 of FIG. 1 is separated into two to form base regions 21a and 21b. According to this semiconductor device, two multi-emitter rear-stage transistors 12a and 12b are formed as shown in FIG. 5. Also such construction may, however, provide the same effect of the construction as shown in FIG. 1.

Figure 6:
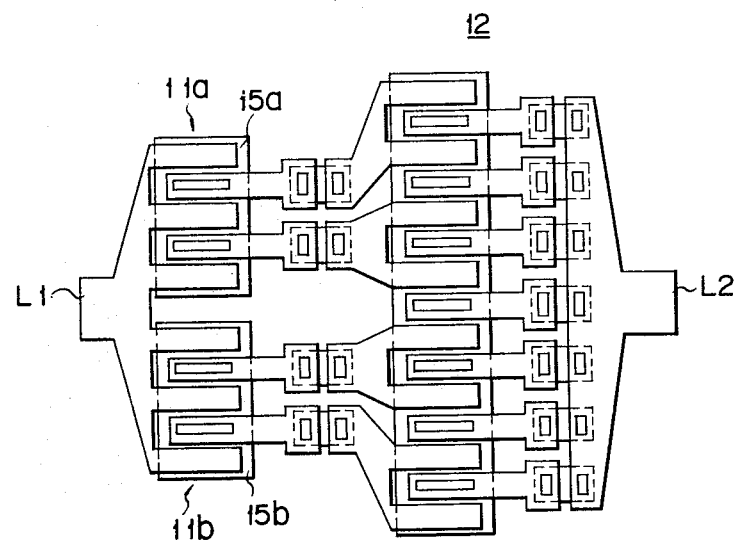
FIG. 6 is a plan of a semiconductor device according to still another embodiment in which the base regions of pre-stage transistors are separated.
Figure 7:
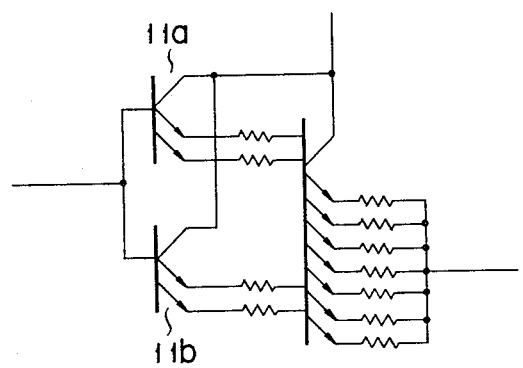
FIG. 7 is an equivalent circuit diagram of the semiconductor device of FIG. 6.

In an embodiment of FIG. 6, the base region 15 of the pre-stage transistor 11 of FIG. 1 is separated into two to form base regions 15a and 15b. In this case, two multi-emitter pre-stage transistors 11a and 11b are formed as shown in FIG. 7. The multi-emitters of the pre-stage transistors 11a and 11b are connected respectively with the multi-bases of the rear-stage transistors through respective resistors.

Figure 8:
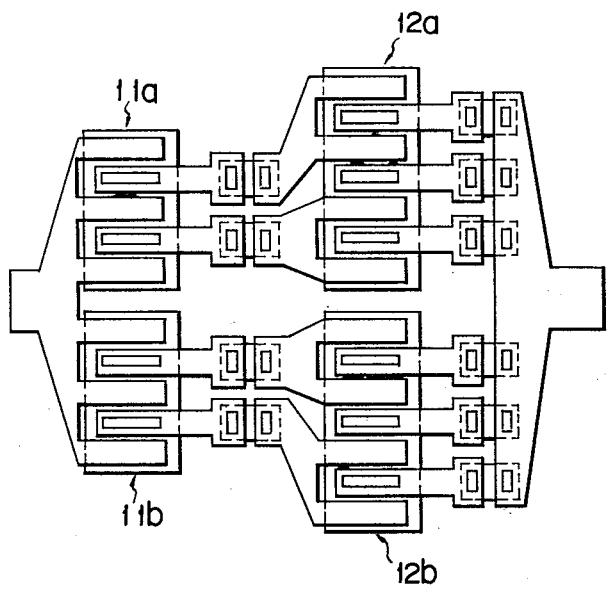
FIG. 8 is a plan of a semiconductor device according to a further embodiment in which the respective base regions of pre- and rear-stage transistors are separated.
Figure 9:
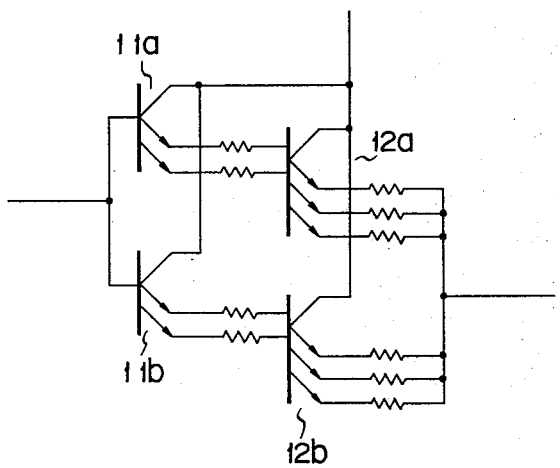
FIG. 9 is an equivalent circuit diagram of the semiconductor device of FIG. 8.

In an embodiment of FIG. 8, each of the base regions of the pre- and rear-stage transistors are separated into two to form base regions 15a and 15b and base regions 21a and 21b. That is, in this embodiment, a Darlington-connected semiconductor device is composed of two multi-emitter pre-stage transistors 11a and 11b and two multi-emitter rear-stage transistors 12a and 12b, as shown in the equivalent circuit diagram of FIG. 9.

Figure 10:
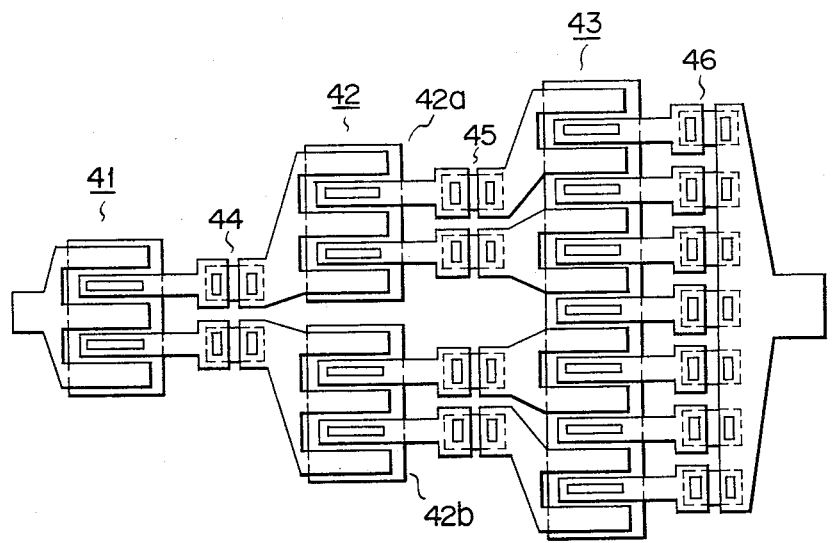
FIG. 10 is a plan of a semiconductor device according to a further embodiment.

In an embodiment of FIG. 10, a Darlington-connected semiconductor device is composed of a pre-stage transistor 41, a mid-stage transistor group 42, a rear-stage transistor 43, and resistor regions 44, 45 and 46.

Figure 11:
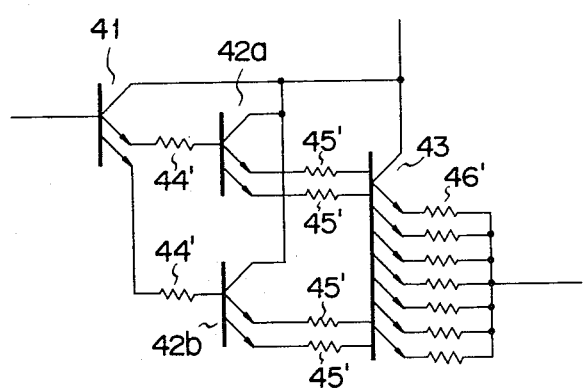
FIG. 11 is an equivalent circuit diagram of the semiconductor device of FIG. 10.

The mid-stage transistor group 42 is formed of two transistors 42a and 42b, and all the transistors are multi-emitter transistors. FIG. 11 shows an equivalent circuit of the semiconductor device of FIG. 10. As may be seen from this circuit diagram, the multi-emitters of the pre-stage transistor 41 are connected respectively to the bases of the mid-stage transistors 42a and 42b through respective resistors 44'. The multi-emitters of the mid-stage transistors 42a and 42b are connected respectively to the multi-bases of the rear-stage transistor 43 through respective resistor 45'.

Figure 12:
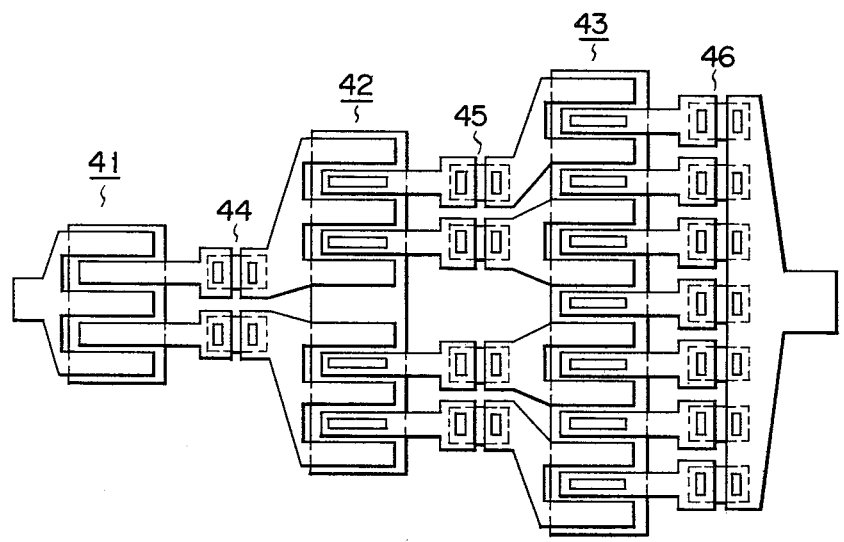
FIG. 12 shows a modification of the semiconductor device of FIG. 10.

Although two mid-stage transistors are used in the embodiment of FIG. 10, they may have their base regions in common, that is, they can be replaced by a single multi-emitter transistor, as shown in FIG. 12.

Figure 13:
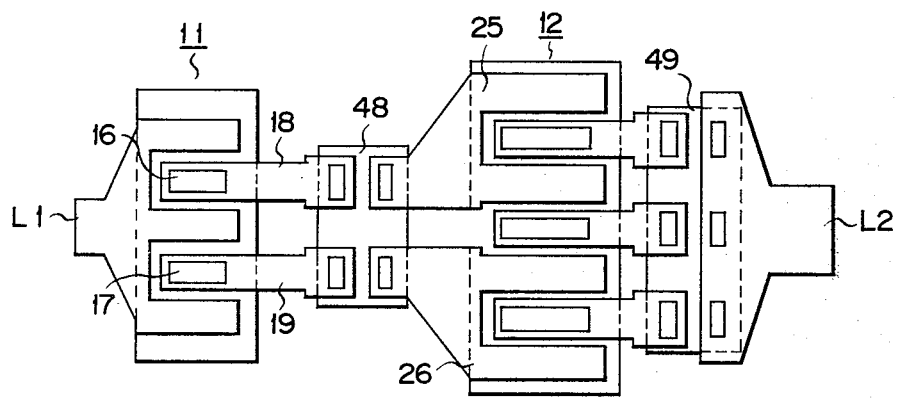
FIG. 13 is a plan of a semiconductor device according to an additional embodiment in which resistors are formed in a single resistor region.

Although in the above-mentioned embodiments all the resistor regions are separated from one another, they may be replaced by common resistor regions 48 and 49, as shown in FIG. 13. In this case, however, the resistor region should preferably be so set that the current flowing between the emitter electrodes 18 and 19 of the pre-stage transistor 11 may be of some percent of the current flowing from the emitter electrodes 18 and 19 to the base electrodes 25 and 26 of the rear-stage transistor 12.

In the semiconductor device of this invention, as described above, the Darlington connection may be provided by means of a plurality of resistor regions, so that the concentration of the emitter current i.e. current crowding can be avoided. Moreover, the base regions of the pre-stage transistor can be made smaller than that of the rear transistor, so that the input impedance may be increased. Thus, there may be obtained a high-frequency, high-output semiconductor device with a high current amplification factor $h_{FE}$ that is characteristic of the Darlington connection, with high withstand voltage maintained. Further, the resistor regions may be formed by, for example, vacuum evaporation of Nichrome or other resistive metal, sputtering of tantalum nitride or some other compound resistor, chemical evaporation of a polycrystalline semiconductor, or combinations of these methods. Also the resistor region may be formed at the same time with the high-density base region provided for the increases of the collector-base withstand voltage and the reduction of the contact resistance. Thus, the safe operation range of the high-frequency, high-output semiconductor device may be widened, and a high-gain transistor may be obtained.

What is claimed is:

1. A Darlington-connected semiconductor device for amplifying an input signal, comprising:

a pre-stage transistor circuit portion including at least one pre-stage transistor with a plurality of emitters, a collector, and at least one base;

input terminal means connected to the base of said pre-stage transistor for receiving an input signal to be amplified by said device;

a rear-stage transistor circuit portion including at least one rear-stage transistor with a plurality of bases and emitters, said rear-stage transistor having a collector in common with said collector of said pre-stage transistor;

a plurality of resistors connected respectively between the emitters of said pre-stage transistor and the bases of said rear-stage transistor, to connect said input terminal means to the bases of said rear-stage transistor through the emitters of said pre-stage transistor and said resistors; and output terminal means connected to the emitters of said rear-stage transistor for receiving an amplified form of said input signal.

2. A semiconductor device according to claim 1, wherein said rear-stage transistor circuit portion includes a plurality of rear-stage transistors each having multi-bases, the bases of said rear-stage transistors being connected respectively to the emitters of said pre-stage transistor.

3. A semiconductor device according to claim 2, wherein said pre-stage transistor circuit portion includes a plurality of pre-stage transistors each having multi-emitters, the multi-emitters of said pre-stage transistors being connected respectively to the bases of said rear-stage transistors.

4. A semiconductor device according to claim 1, wherein said pre-stage transistor circuit portion includes a plurality of pre-stage transistors each having multi-emitters, the multi-emitters of said pre-stage transistors being connected respectively to said plurality of bases of said rear-stage transistor through said resistors.

5. A Darlington-connected semiconductor device for amplifying an input signal, comprising:
a pre-stage transistor circuit portion including at least one pre-stage transistor with a plurality of emitters, a collector, and at least one base;
input terminal means connected to the base of said pre-stage transistor for receiving an input signal to be amplified by said device;
a mid-stage transistor circuit portion including at least one mid-stage transistor with a plurality of bases and emitters, and having a collector connected in common with said collector of said pre-stage transistor;
a plurality of first resistors connected respectively between the emitters of said pre-stage transistor and the bases of said mid-stage transistor;
a rear-stage transistor circuit portion including at least one rear-stage transistor with a plurality of bases and emitters, and having a collector connected in common with collectors of said pre- and mid-stage transistors;
a plurality of second resistors connected respectively between the emitters of said mid-stage transistor and the bases of said rear-stage transistor; and
output terminal means connected to the emitters of said rear-stage transistor for receiving an amplified form of said input signal.

6. A semiconductor device according to claim 5, wherein said mid-stage transistor circuit portion includes a plurality of mid-stage transistors each having multi-bases and multi-emitters, the bases of said mid-stage transistors being connected respectively to the emitters of said pre-stage transistor through said first resistors, and said multi-emitters being connected respectively to the bases of said rear-stage transistor through said second resistors.

* * * * *